United States Patent [19]

Flatley

[11] 4,178,191
[45] Dec. 11, 1979

[54] PROCESS OF MAKING A PLANAR MOS SILICON-ON-INSULATING SUBSTRATE DEVICE

[75] Inventor: Doris W. Flatley, Belle Mead, N.J.

[73] Assignee: RCA Corp., New York, N.Y.

[21] Appl. No.: 932,626

[22] Filed: Aug. 10, 1978

[51] Int. Cl.$^2$ .................. H01L 21/225; H01L 21/263; H01L 11/00
[52] U.S. Cl. ................................... 148/1.5; 148/187; 357/23; 357/49; 357/52; 357/91
[58] Field of Search ................... 148/1.5, 187; 357/91, 357/23, 52, 49

[56] References Cited

U.S. PATENT DOCUMENTS

| | | | |
|---|---|---|---|
| 3,890,632 | 6/1975 | Ham et al. | 357/23 |
| 4,081,292 | 3/1978 | Aoki et al. | 148/1.5 |
| 4,098,618 | 7/1978 | Crowder et al. | 148/1.5 |

OTHER PUBLICATIONS

Rideout "Reducing Laterel Oxidation...", IBM-TDB, 18 (1975), 1616.
Nomura et al., "Enhanced Oxidation of Si...", Ion-Implantation in Semiconductor, S. Hambe, Plenum, 1974, p. 681.
Bhatia et al., "Isolation Process for Shallow Tunction...", IBM-TDB, 19 (1977), 4171.
Shamakura et al., "B and P Diffusion ... SiO$_2$...", Solid State Electronics, 18 (1975), 991.
Prince et al., "Diffusion of B from Implanted Source...", J. Electrochem. Soc. 121 (1974), 705.
Capell et al., "... C-MOS on Sapphire ...", Electronics, May 1977, p. 99.
Fritzes et al., "Thermal Oxidation of Si...", J. Electrochem. Soc. 120 (1973), 1603.
Hess et al., "... Oxidation ... Ion-Implantation ...", J. Appl. Phys. 48 (1977), 834.
Christodoulides et al., "... Ion Implanted, ... Oxidized Si", J. Electrochem. Soc. 124 1977, 1651.

*Primary Examiner*—L. Dewayne Rutledge
*Assistant Examiner*—Upendra Roy
*Attorney, Agent, or Firm*—H. Christoffersen; D. S. Cohen; L. P. Benjamin

[57] ABSTRACT

An improved process of forming planar silicon-on-sapphire MOS integrated circuit devices by a local oxidation process in which portions of a silicon layer on a sapphire substrate are thermally oxidized throughout the thickness of the layer to provide interdevice dielectric isolation and a substantially planar topology includes a step of ion implanting phosphorus, boron, or a combination thereof into the silicon prior to the thermal oxidation step. The implanted impurities have a stabilizing effect on the devices thereafter built in the remaining silicon.

8 Claims, 5 Drawing Figures

PROCESS OF MAKING A PLANAR MOS SILICON-ON-INSULATING SUBSTRATE DEVICE

This invention relates to a process of making integrated circuit devices of the type fabricated from epitaxial silicon on an insulating substrate.

MOS integrated circuit devices made from a layer of epitaxial silicon on an insulating substrate, usually sapphire, are well known. In early devices, isolation between such circuit elements as MOS transistors was obtained by etching away undesired portions of the silicon layer to expose the underlying substrate. Islands of silicon remained in which the circuit elements were fabricated. Significant yield problems plagued these devices, traceable largely to the high step, between the top of the silicon island and the surface of the substrate, across which metallization conductors extended.

Attempts have been made to produce so-called planar silicon-on-sapphire devices. In these devices, the spaces around the silicon island have been filled with an insulator having an upper surface generally coplanar with the upper surface of the silicon island. One method for achieving this result is known as local oxidation of silicon-on-sapphire (see "Electronics" for May 26, 1977 at page 101). In this process the initial silicon layer is masked, to protect the portions thereof which are intended to remain, with an oxidation resistant masking material, usually silicon nitride, and an anisotropic solvent is then used to etch the unmasked silicon to approximately half its original thickness. The silicon which remains is then thermally oxidized down to the silicon-sapphire interface to produce a silicon dioxide field insulator.

While the local oxidation method is quite effective to produce the planar topology which is desired in these devices, it has been discovered that N channel aluminum gate MOS devices so produced are unstable under conditions of elevated temperature and applied bias. Silicon gate devices produced by this process are usually also unstable, although the instability can be overcome in these devices by employing a blanket of heavily phosphorus doped silicon dioxide over the finished device.

Nonplanar silicon-on-sapphire MOS devices can be made stable by employing controlled boron doping of the edge of the device. See U.S. Pat. No. 3,890,632 to Ham et al., assigned to RCA Corporation. The prior art does not suggest, however, how this technique could be employed with the local oxidation technique to obtain the benefit of both processes.

Figure 1:
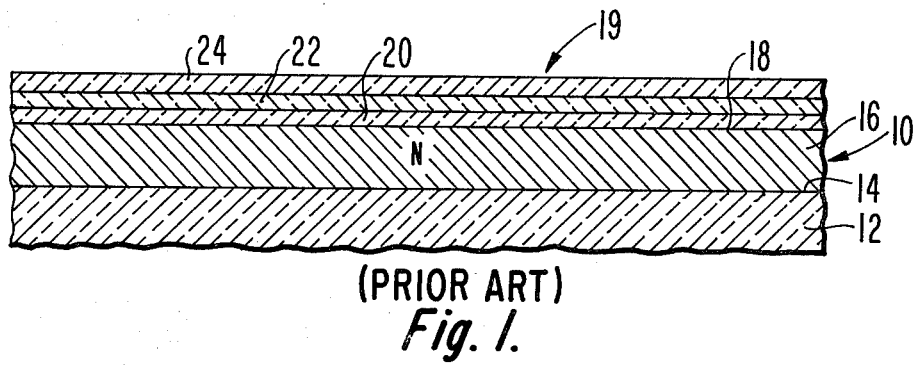
FIG. 1 is a partial cross-sectional view of a silicon-on-sapphire wafer at an initial stage of the present novel process or a prior art process.

The present process begins with a wafer 10 comprising a sapphire substrate 12 having a surface 14 on which is a layer 16 of silicon which is epitaxially related to the substrate. When the silicon is intended for a complementary MOS integrated circuit, it is usually doped initially to be of N type conductivity at a level appropriate for the channels of the P channel devices. The silicon layer 16 has an upper surface 18 on which is provided a layered structure 19 consisting of a first layer 20 of thermally grown $SiO_2$, a second layer 22 of chemical-vapor-deposited silicon nitride, and a capping layer 24, again of silicon dioxide. The configuration of FIG. 1 is the same for both prior processes and the present process.

Next, the layered structure 19 is provided with a photoresist coating (not shown) and the layers 20, 22, and 24 are removed by etching to define an etch-resistant, oxygen impermeable masking coating 26. See FIG. 2. Then, an anisotropic silicon etchant is applied to the unmasked surface of the silicon layer 16 and the silicon is etched to remove portions of the layer 16 down to a depth about one-half the thickness of the original silicon layer 16. Half the silicon is removed because the remaining silicon will later be thermally oxidized and the thickness of the resulting silicon dioxide is known to be about twice the thickness of the silicon being oxidized. The desired result is to produce a surface on this oxide which is substantially coplanar with the surface of the remaining silicon.

Figure 2:
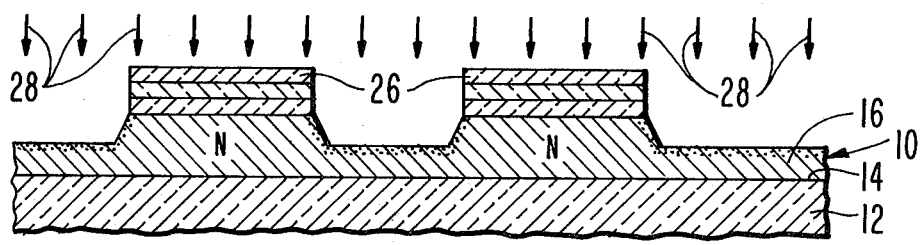
FIG. 2 is a partial cross-sectional view through the wafer at an intermediate stage of the present process.

Thus far the steps described are conventionally practiced in the local oxidation process referred to above. The present process departs at this point from the known process. Prior to the conventional thermal oxidation step, stabilizing impurities are introduced by ion implantation into the surface of the unmasked silicon. This step is illustrated in FIG. 2 by means of the vertical arrows 28 and the stippling within the silicon adjacent to the unmasked areas. The stabilizing impurities which are introduced may be phosphorus, boron, or combinations of phosphorus and boron as will be explained below.

Figure 3:
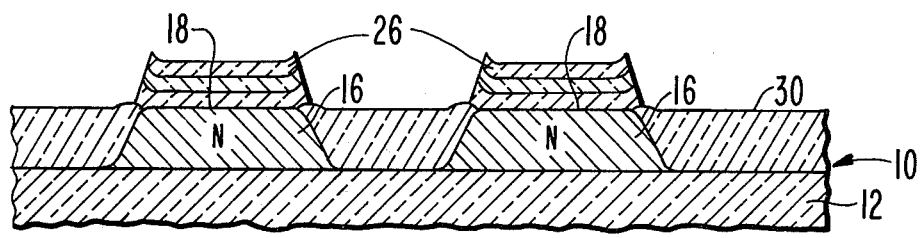
FIG. 3 is a partial cross-sectional view of the wafer at a still later stage in the present process.

After the implantation step, specific examples of which are described below, standard processing resumes. Thus, as shown in FIG. 3, the wafer 10 is subjected to an oxidizing treatment which thermally oxidizes the unmasked silicon to convert it to silicon dioxide in surrounding relation to the remaining masked silicon and with an upper surface 30 which is substantially coplanar with the original surface 18 of the silicon layers 16. After the thermal oxidizing step, conventional steps are employed to fabricate the transistors in the remaining silicon. These steps will involve heating the wafer 10 and the heat treatment in later steps is useful when boron is the stabilizing impurity species which is employed.

In one species of the present novel method, phosphorus is the stabilizing impurity which is implanted prior to the thermal oxidation step. In this embodiment it is the gettering property of phosphorus which is relied upon.

Figure 4:
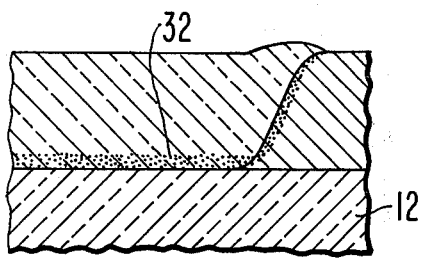
FIGS. 4 and 5 are enlarged partial, cross-sectional views illustrating the results of two specific embodiments of the present process.

FIG. 4 illustrates the result of employing phosphorus in this process. When the thermal oxidation is done at standard, relatively low temperatures, i.e. 900° C. or lower, the phosphorus originally implanted into the silicon will tend to remain in the silicon at the silicon dioxide, silicon interface. Thus, in the finished structure shown in FIG. 4, the phosphorus is represented by the stippling 32 adjacent to the oxide-sapphire interface. Some care must be taken as to the dosage of the ion implantation step. If the implant dose is low, i.e. if the resultant maximum concentration of impurities (Nmax) is less than $1 \times 10^{16}$ cm$^{-3}$, there should be no problem with introducing phosphorus into the edge of the silicon (creating a possible leakage path in the device to be later formed), because the oxidation rate is greater than the diffusion rate at the relatively low temperatures here involved. If the Nmax is greater than $5\times 10^{17}$ cm$^{-3}$, the oxidation rate will be accelerated but there will be much more phosphorus present, and later high temperature steps could cause doping of the buried edge of the silicon island.

To avoid leakage paths produced in this way, another species of the present invention may be employed. In this species both phosphorus and boron are implanted prior to the thermal oxidation step. Preferably, the phosphorus implant is a shallow one, at an energy of 40–60 keV and at a dose of about $1\times 10^{15}$/cm$^2$ for example. The boron implant for, for example, a film of silicon which is 0.3$\mu$ thick (half a starting thickness of 0.6$\mu$) is a deep implant at an energy of about 70–100 keV and at a dose of about $1\times 10^{15}$/cm$^2$, for example. With both boron and phosphorus in the surrounding oxide, there will be diffusion of both species into the edge of the silicon island, with a compensating effect.

Figure 5:
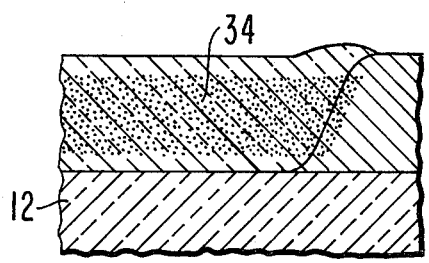

Still another species of the present method involves the implantation of boron alone prior to the thermal oxidizing step. Here the idea is to create a dopant source of boron in the surrounding oxide for the edge of the silicon island. This is readily achieved because during the thermal oxidation step the boron will tend to segregate into the oxide, thus distributing boron throughout the thickness of the oxide as suggested in FIG. 5 by the stippling 34 which extends substantially throughout the silicon dioxide layer. The subsequent high temperature steps employed to fabricate the active device will then drive boron into the edge of the island producing a result similar to that produced in the Ham et al process for nonplanar devices. In this example, the boron implant is typically done at 20–30 keV, with a dose of about $5\times 10^{12}$ to $1\times 10^{13}$/cm$^2$.

I claim:

1. In a process of making a planar silicon-on-insulating-substrate device which process includes the steps of forming an etch resistant, oxygen impermeable masking coating on discrete areas of the surface of a layer of silicon on an insulating substrate, and etching the unmasked portions of said silicon layer down to a depth about one-half the thickness of said silicon layer, the improvement comprising:

without removing said masking coating, introducing stabilizing impurities into the surface of the unmasked portions of the silicon layer, and thereafter thermally oxidizing only the unmasked portions of the silicon layer to convert it to stabilized silicon dioxide in surrounding relation to the remaining masked portions of the silicon layer.

2. A process of making a planar silicon-on-insulating-substrate device as defined in claim 1 wherein the step of introducing stabilizing impurities is carried out by ion implantation.

3. A process of making a planar silicon-on-insulating-substrate device as defined in claim 2 wherein the introduced stabilizing impurities are phosphorus atoms.

4. A process of making a planar silicon-on-insulating-substrate device as defined in claim 3 wherein the step of thermally oxidizing the unmasked silicon is carried out at a temperature less than 900° C.

5. A process of making a planar silicon-on-insulating-substrate device as defined in claim 4 wherein said ion implantation step is carried out at an energy level of 50 KeV and at a dose of about $10^{12}$/cm$^2$ to achieve a maximum concentration of impurities of about $1\times 10^{16}$/cm$^3$.

6. A process of making a planar silicon-on-insulating-substrate device as defined in claim 4, in which said layer of silicon is initially formed to a thickness of about 0.6$\mu$ thick, and wherein said ion implantation is carried out at an energy level of 40–60 KeV at a dose of about $1\times 10^{15}$/cm$^2$, said process further comprising:

ion implanting boron in addition to said phosphorus, at an energy level of 70–100 KeV and at a dose of $1\times 10^{15}$/cm$^2$ prior to the thermal oxidation step.

7. A process of making a planar MOS silicon-on-insulating-substrate device as defined in claim 2 wherein the introduced stabilizing impurities are boron atoms.

8. A process of making a planar MOS silicon-on-insulating-substrate device as defined in claim 7 comprising the further step of:

heating said device during further processing of the remaining silicon, to diffuse the boron atoms out of said silicon dioxide into said remaining silicon.

* * * * *